(12) United States Patent
Law et al.

(10) Patent No.: US 8,212,297 B1
(45) Date of Patent: Jul. 3, 2012

(54) HIGH OPTICAL EFFICIENCY CMOS IMAGE SENSOR

(75) Inventors: Pui Chung Simon Law, Hong Kong (HK); Dan Yang, Hong Kong (HK); Xunqing Shi, Hong Kong (HK)

(73) Assignee: Hong Kong Applied Science and Technology Research Institute Company Limited, Hong Kong Science Park, Shatin, New Territories, Hong Kong (CN)

( * ) Notice: Subject to any disclaimer, the term of this patent is extended or adjusted under 35 U.S.C. 154(b) by 70 days.

(21) Appl. No.: 13/010,800

(22) Filed: Jan. 21, 2011

(51) Int. Cl.
*H01L 31/062* (2012.01)

(52) U.S. Cl. ................ 257/292; 257/E27.133

(58) Field of Classification Search .......... 257/213, 257/288, 290, 291, 292, 293, 294, E27.132, 257/E27.133
See application file for complete search history.

(56) References Cited

U.S. PATENT DOCUMENTS

| | | | |
|---|---|---|---|
| 6,607,951 B2 | 8/2003 | Chen et al. | |
| 7,119,322 B2 | 10/2006 | Hong | |
| 2008/0203452 A1 | 8/2008 | Moon et al. | |
| 2009/0200624 A1 | 8/2009 | Dai et al. | |
| 2010/0141816 A1 | 6/2010 | Maruyama et al. | |
| 2010/0193845 A1 | 8/2010 | Roy et al. | |
| 2010/0193848 A1 | 8/2010 | Lee | |
| 2012/0032241 A1* | 2/2012 | Huang et al. | 257/290 |
| 2012/0061789 A1* | 3/2012 | Yang et al. | 257/443 |

* cited by examiner

*Primary Examiner* — Ha Tran T Nguyen
*Assistant Examiner* — Kevin Quinto
(74) *Attorney, Agent, or Firm* — Ella Cheong Hong Kong; Margaret A. Burke; Sam T. Yip

(57) ABSTRACT

High optical efficiency CMOS image sensors capable of sustaining pixel sizes less than 1.2 microns are provided. Due to high photodiode fill factors and efficient optical isolation, microlenses are unnecessary. Each sensor includes plural imaging pixels having a photodiode structure on a semiconductor substrate adjacent a light-incident upper surface of the image sensor. An optical isolation grid surrounds each photodiode structure and defines the pixel boundary. The optical isolation grid extends to a depth of at least the thickness of the photodiode structure and prevents incident light from penetrating through the incident pixel to an adjacent pixel. A positive diffusion plug vertically extends through a portion of the photodiode structure. A negative diffusion plug vertically extends into the semiconductor substrate for transferring charge generated in the photodiode to a charge collecting region within the semiconductor substrate. Pixel circuitry positioned beneath the photodiode controls charge transfer to image readout circuitry.

15 Claims, 9 Drawing Sheets

510

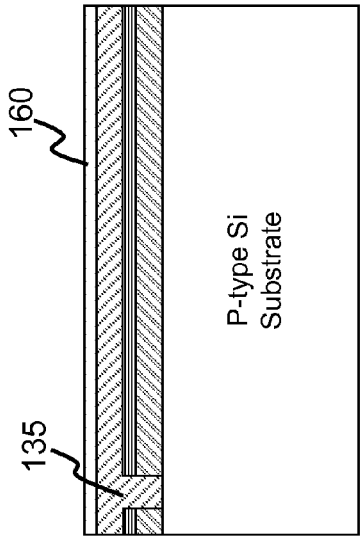
FIG. 1A  P-type silicon wafer with P-I-N epi layer
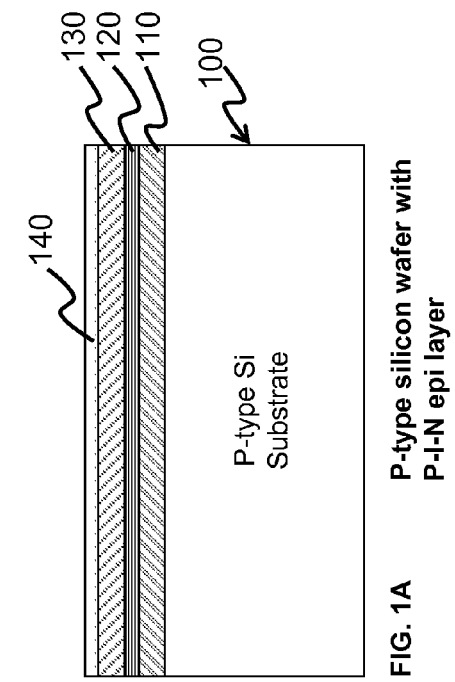
FIG. 1B  P-circle diffusion plug patterning & P+ implant
FIG. 1C
FIG. 1D  PR remove, wafer annealing & oxide deposition
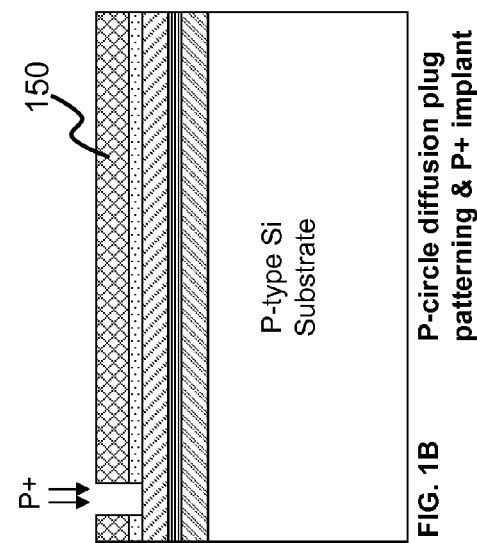
FIG. 1E  Bond the P-type Si substrate to 1st silicon handling wafer & annealing

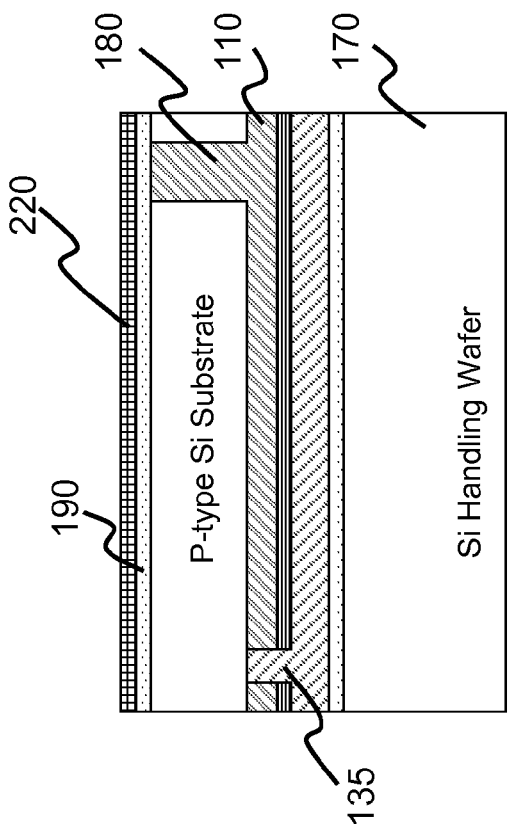
FIG. 1H  PR remove, wafer annealing & oxide and silicon nitride deposition
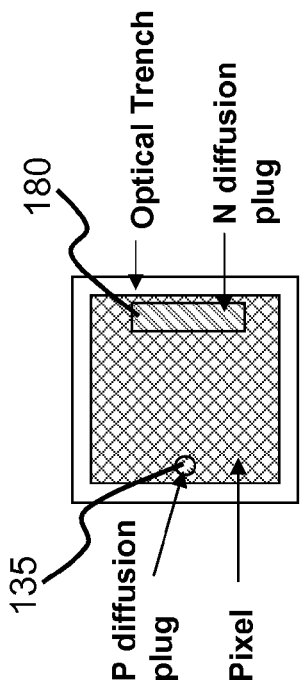
FIG. 1I
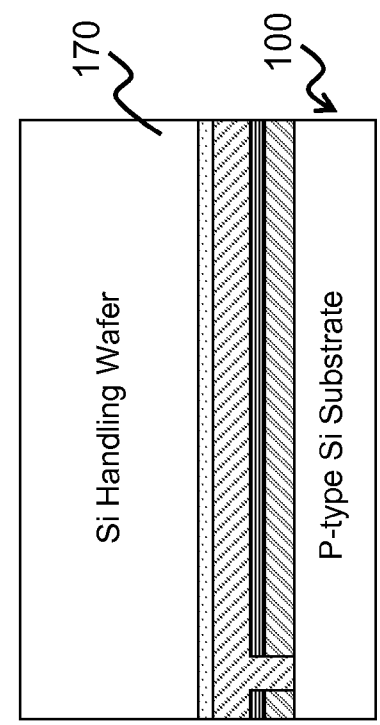
FIG. 1F  Thin P-type Si substrate
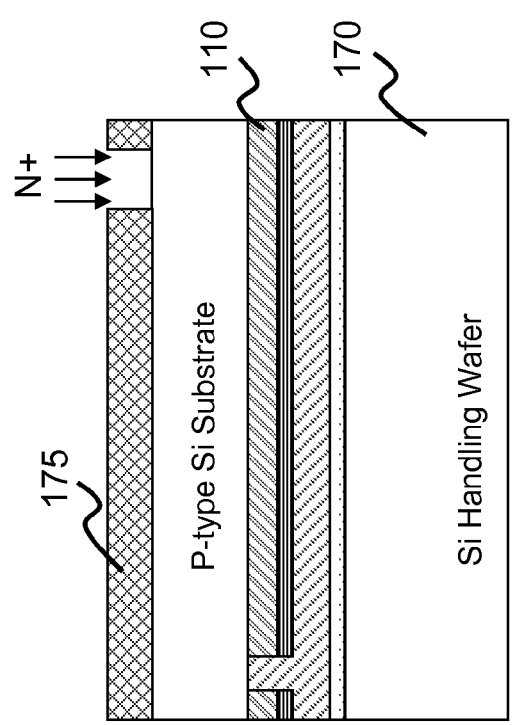
FIG. 1G  Flip-over, Strip N-diffusion plug patterning & N+ implant

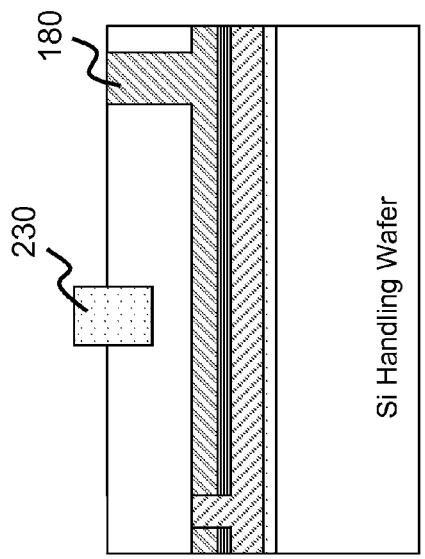
FIG. 1L  Shallow trench oxide deposition, remove oxide & SiN
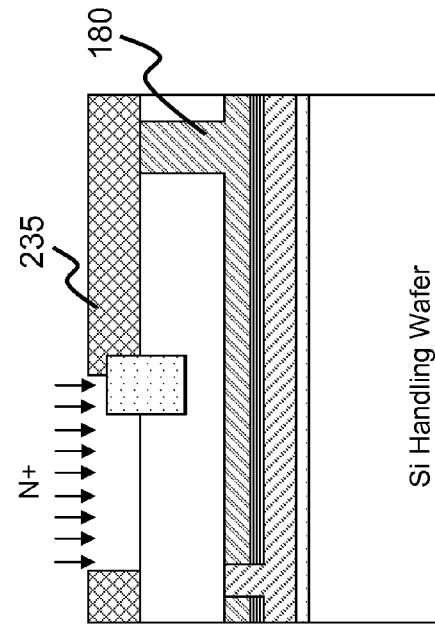
FIG. 1M  N-well patterning & N+ implant
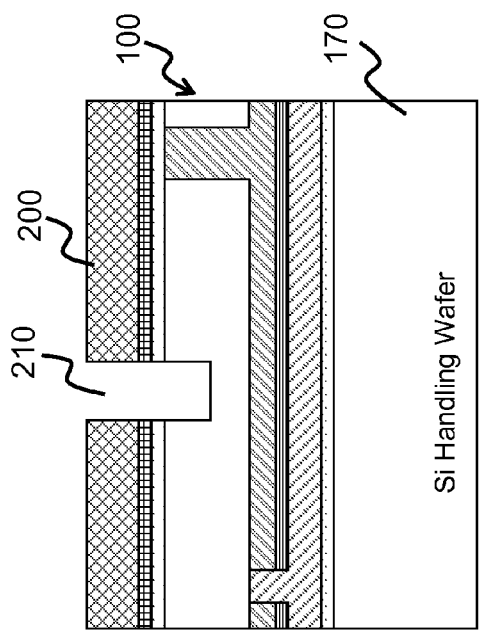
FIG. 1J  Shallow trench patterning & etching
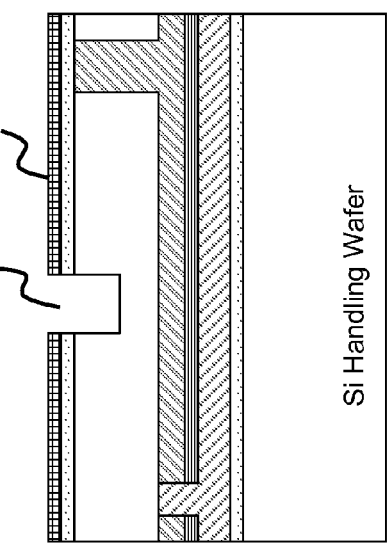
FIG. 1K  Remove PR

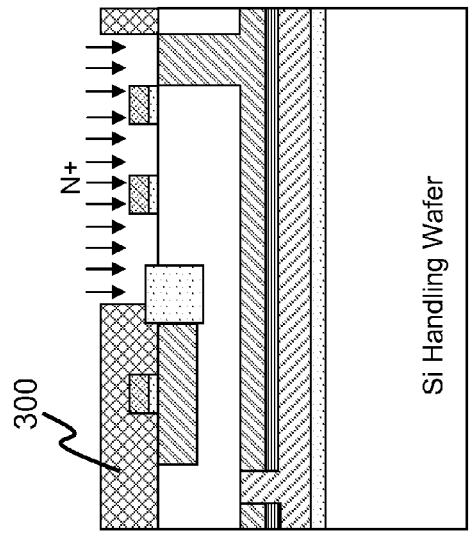
FIG. 1P  Wafer patterning & N+ implant
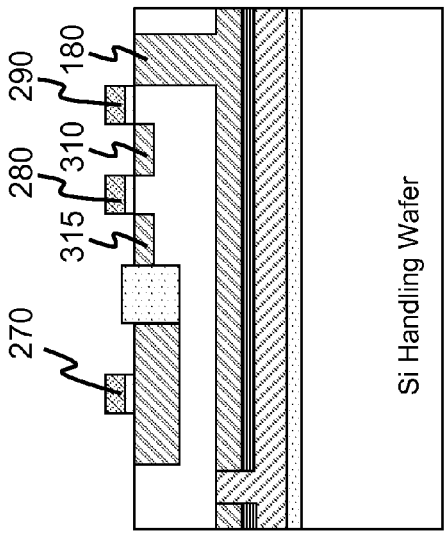
FIG. 1Q  PR remove, wafer annealing
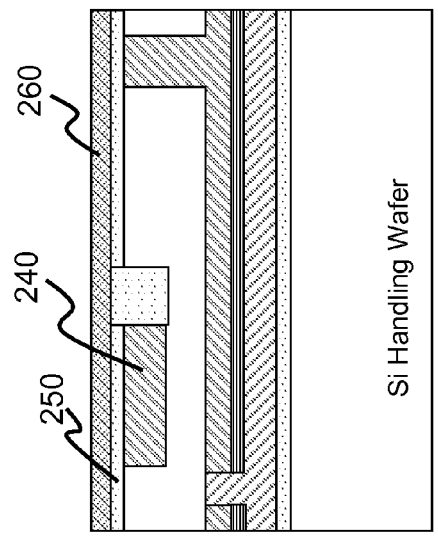
FIG. 1N  Wafer annealing, gate oxide & polySi deposition
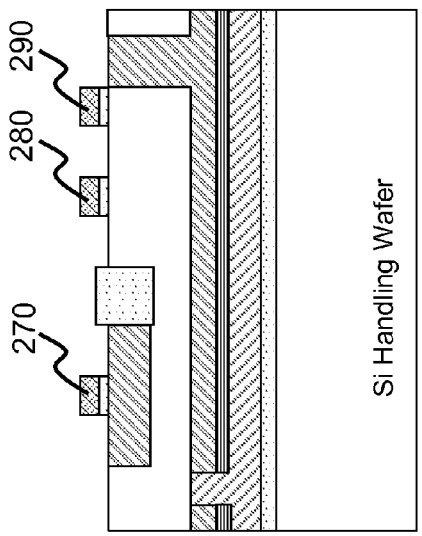
FIG. 1O  Gate electrode patterning & etching

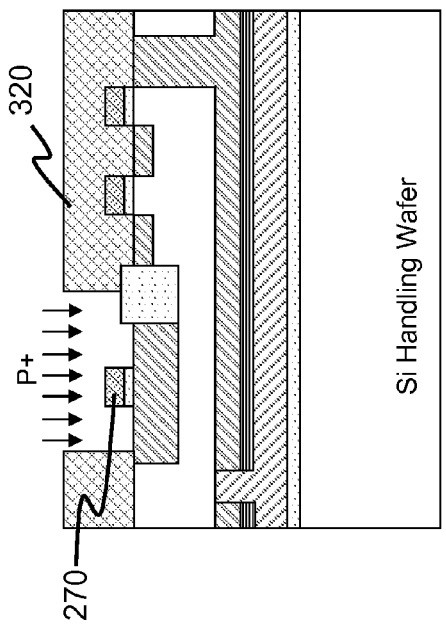
FIG. 1R Wafer patterning & P+ implant
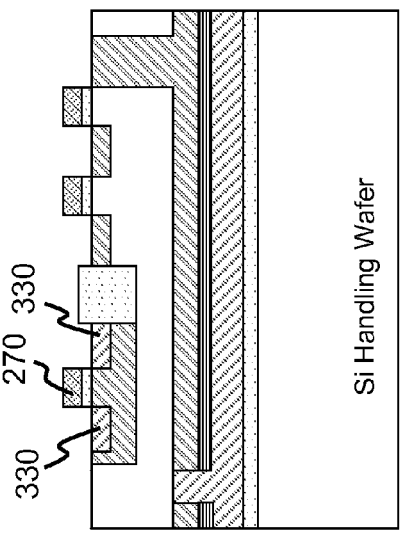
FIG. 1S PR remove & wafer annealing
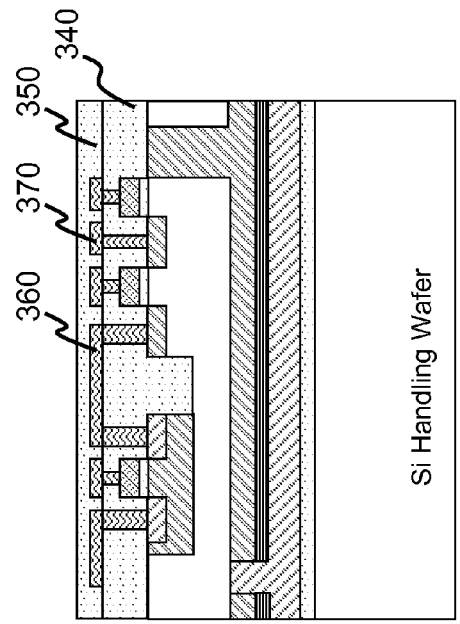
FIG. 1T PR remove & wafer annealing
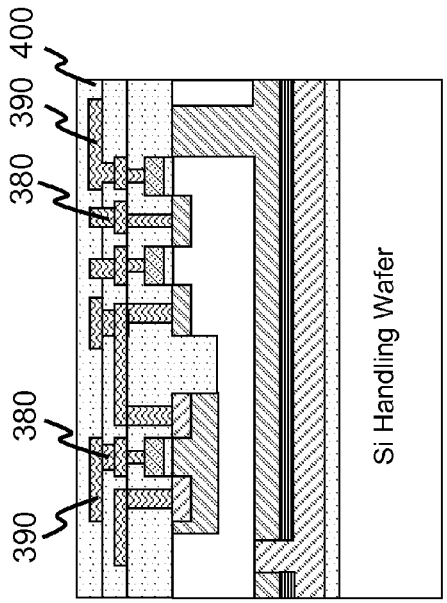
FIG. 1U Vertical interconnect fabrication, RDL & passivation

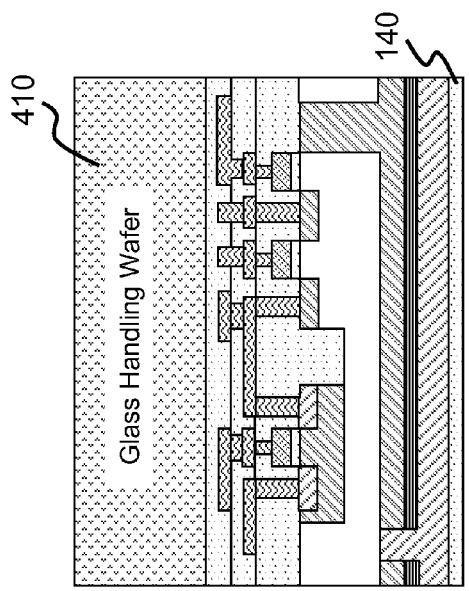
FIG. 2B  Thin wafer & stop at the oxide layer
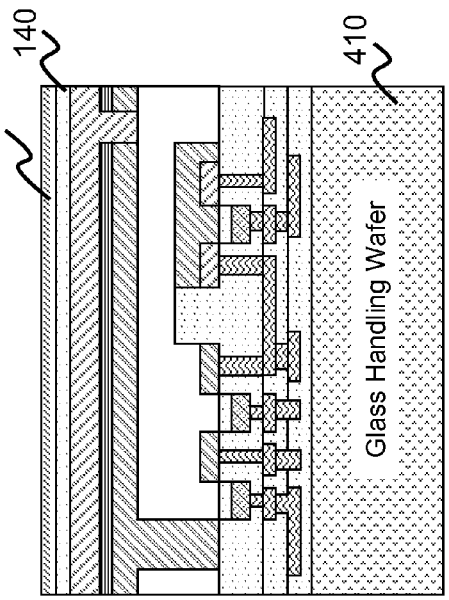
FIG. 2C  Flip over & anti-reflective layer coating
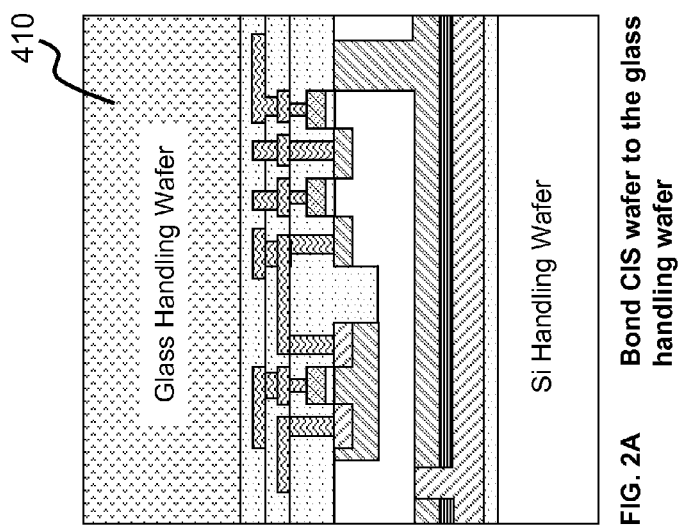
FIG. 2A  Bond CIS wafer to the glass handling wafer

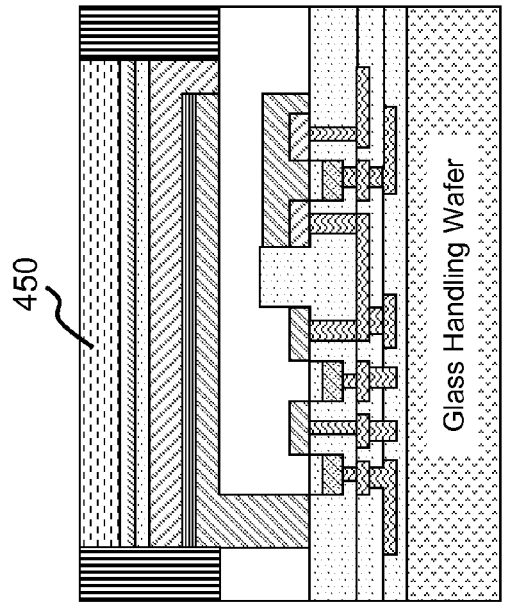
FIG. 2D  Optical isolation trench patterning & etching
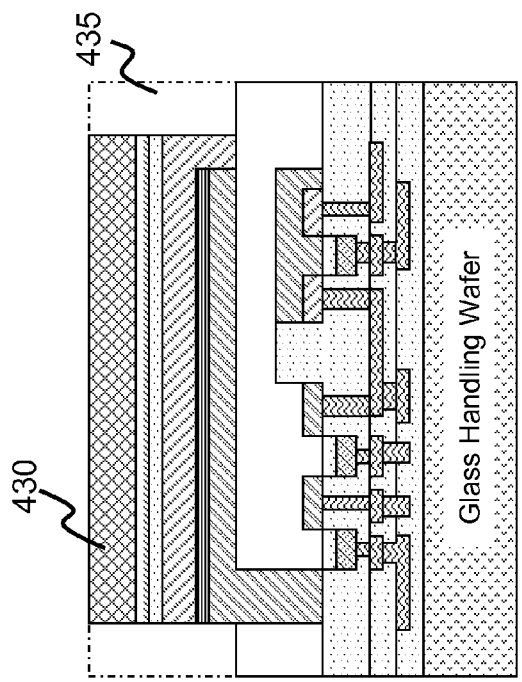
FIG. 2F  Red color filter coating & curing
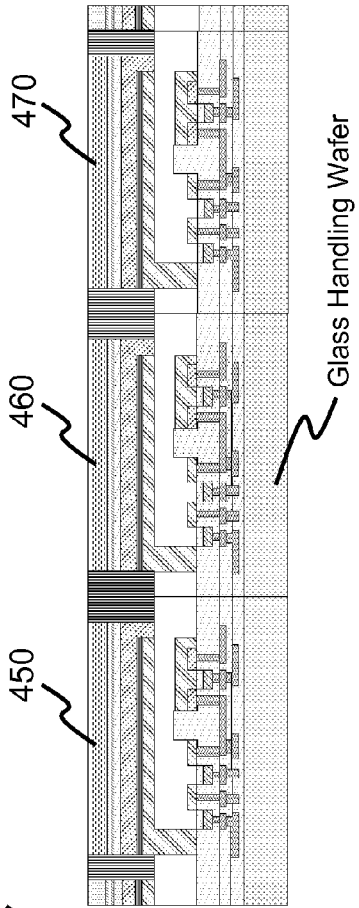
FIG. 2E  Optical isolation trench deposition
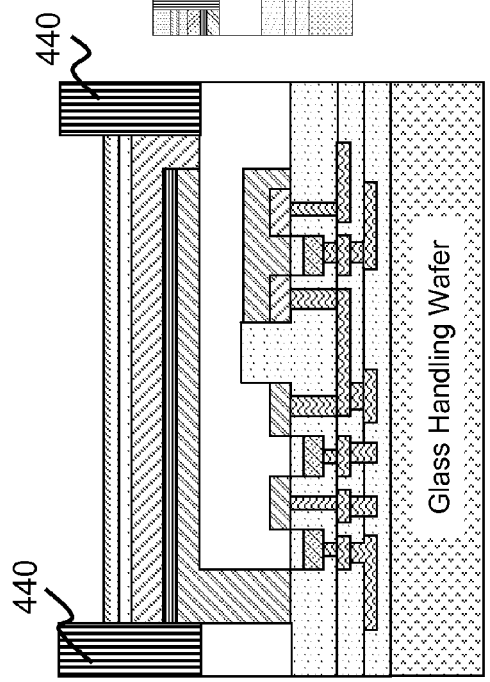
FIG. 2G  Green & blue color filter coating & curing

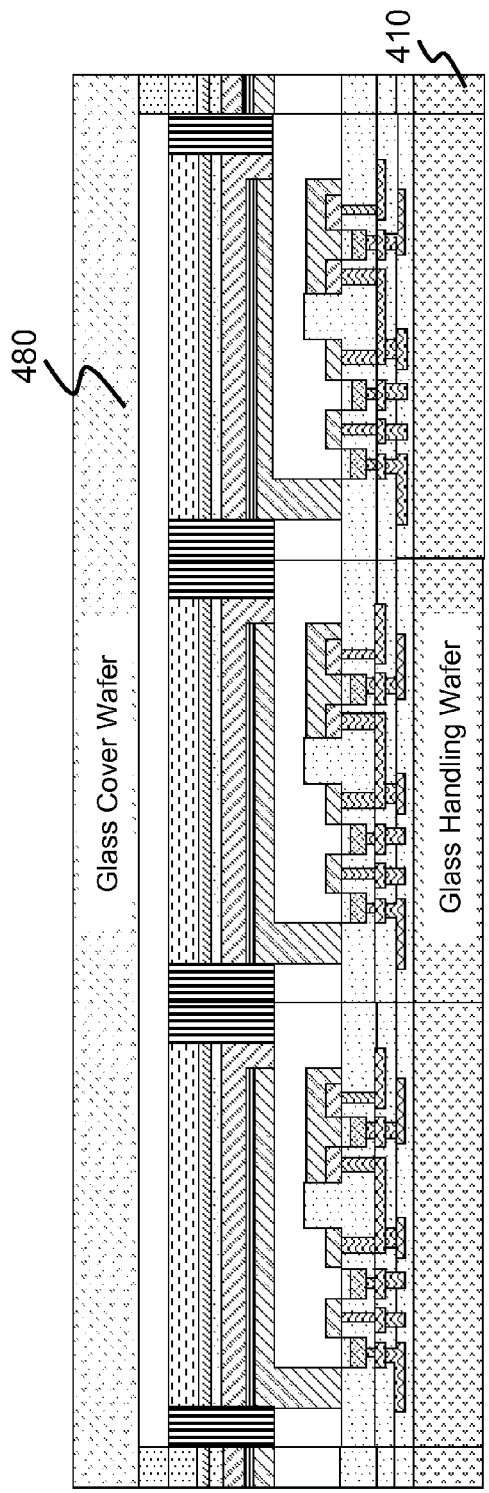
FIG. 2H  Bond the CIS wafer to the cover glass wafer
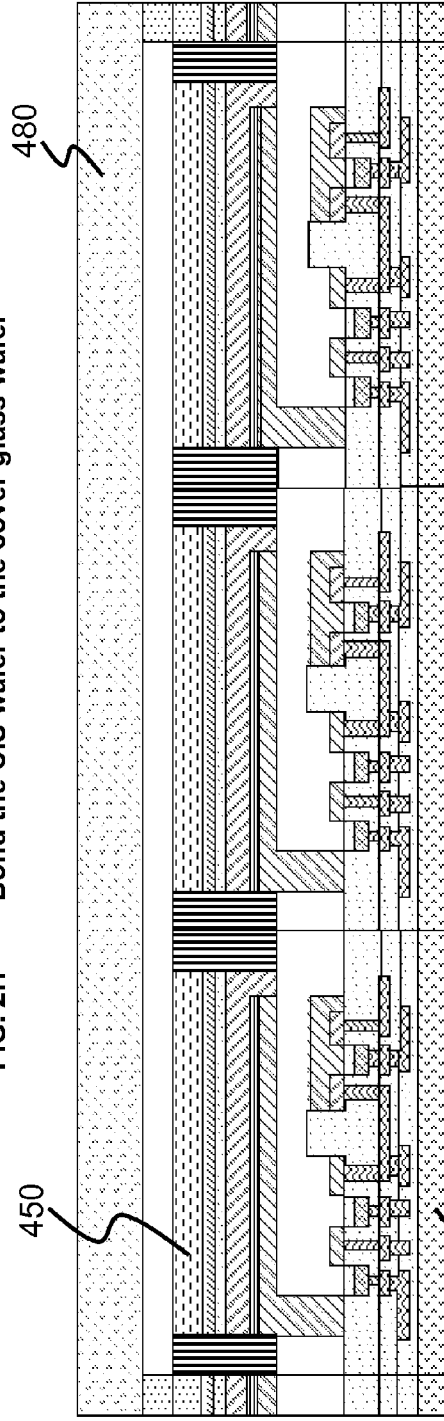
FIG. 2I  Thin glass handling wafer

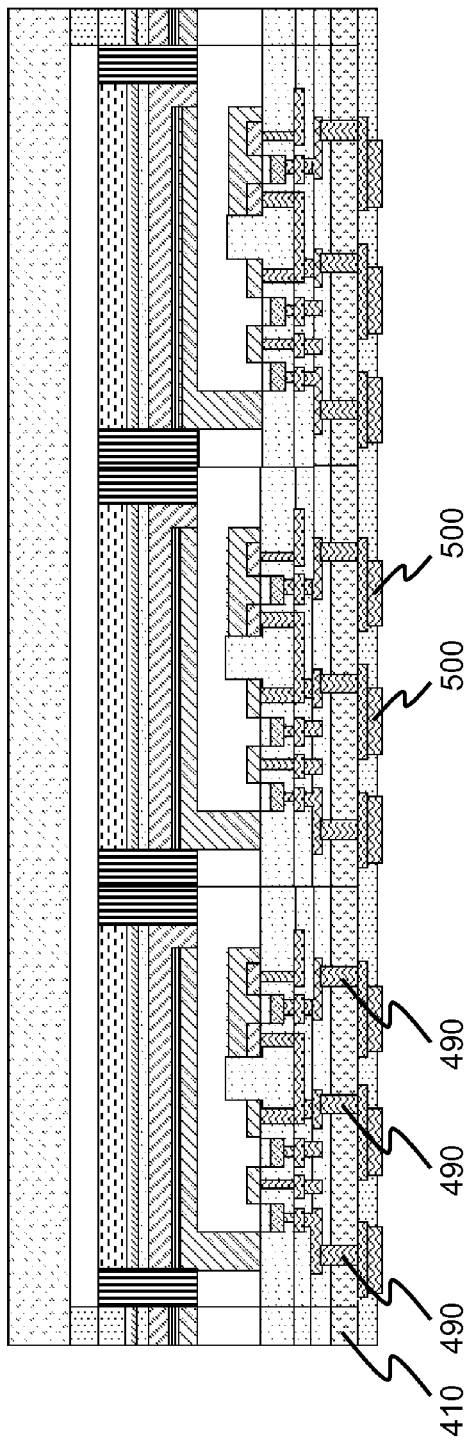
FIG. 2J   TSV, RDL & bonding pad preparation
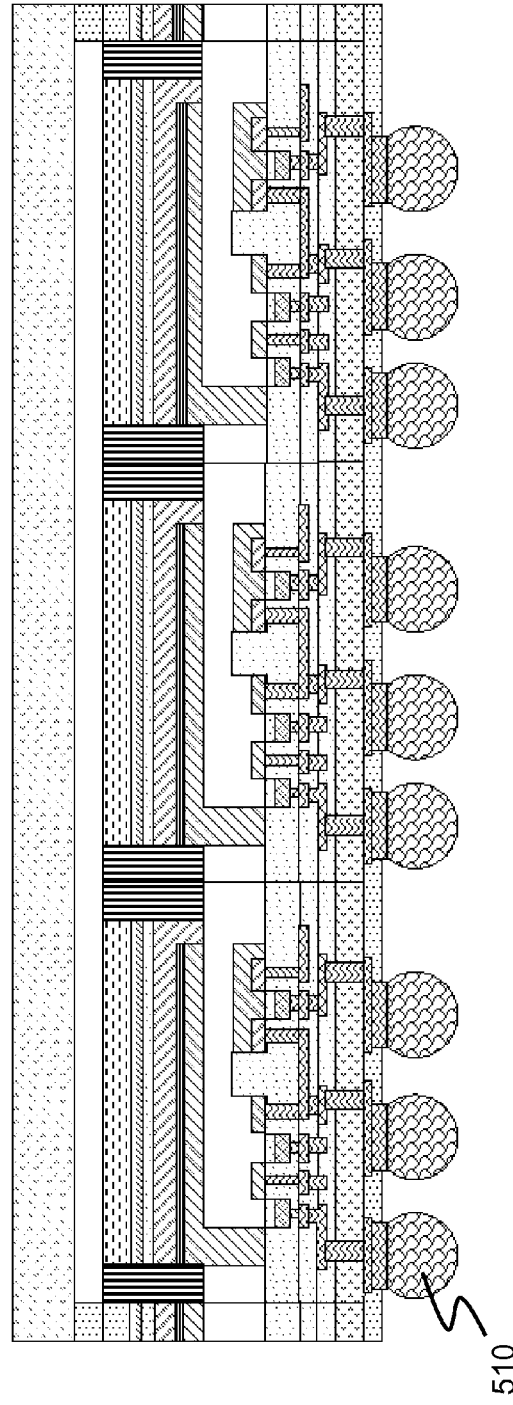
FIG. 2K   Ball attach & reflow to form solder joints

HIGH OPTICAL EFFICIENCY CMOS IMAGE SENSOR

FIELD OF THE INVENTION

The present invention relates to CMOS image sensors in general and, more particularly, to CMOS image sensors having high optical efficiencies, high fill factors, and low optical and electrical crosstalk.

BACKGROUND OF THE INVENTION

Solid state imaging devices such as charge coupled devices (CCDs) and complementary metal oxide semiconductor (CMOS) image sensors are widely used in imaging applications ranging from cameras to mobile telephones and computers. Because CMOS manufacturing technology is compatible with the formation of other semiconductor devices, it is possible to integrate CMOS image sensors with other devices.

CMOS image sensors fall broadly into two categories: front side illumination sensors and back side illumination sensors. In front side illumination devices, the photodiode that captures the photons is positioned relatively far from the incident light. Thus back side illumination devices, in which the photodiode is positioned nearer to the incident light, have increasingly been developed. However, the circuitry for driving the imaging sensor has conventionally been positioned in regions between adjacent photodiodes, limiting the area for light capture available to the photodiode (that is, limiting the "fill factor" of the device, the ratio of the area of the photodiode to the area of the pixel). Laterally positioned circuitry that competes for chip cross-sectional area with the photodiode thus significantly reducing the sensing area.

Further, conventional CMOS image sensors combine the use of smaller photodiodes (lower "fill factor" photodiodes) with microlenses in an attempt to reduce optical crosstalk between adjacent pixels. However, the use of microlenses requires a pixel size of at least on the order of 1.2 microns. Due to this minimum pixel size, increased pixel density with pixels of smaller sizes is impossible, thereby setting a limit on image resolution for image sensors using microlenses.

Electrical cross-talk is also a problem impeding the development of smaller pixel sizes. Smaller pixel sizes results in a higher pixel density per unit area, increasing the problem of both electrical and optical crosstalk between neighboring pixels.

Thus there is a need in the art for improved CMOS image sensors with larger photodiode fill factors that do not require microlenses, thereby permitting the fabrication of images sensors with pixel sizes less than 1.2 microns and increased pixel density. There is also a need in the art for improved CMOS image sensors capable of supporting extremely high pixel density (due to smaller pixel sizes) without high optical and electrical crosstalk.

SUMMARY OF THE INVENTION

The present invention provides high optical efficiency CMOS image sensors capable of sustaining pixel sizes less than 1.2 microns. The sensors include isolation grids that border each pixel and block incident light penetration into adjacent pixels. This results in high optical inter-pixel optical isolation. The image sensor photodiodes possess high fill factors. This feature, coupled with the isolation grids, permit image sensors without microlenses to be fabricated, optionally having pixel sizes less than 1.2 microns, resulting in increased sensor pixel density. Consequently, high resolution image sensors can be formed.

The present invention provides a high optical efficiency CMOS image sensor that includes plural imaging pixels, each pixel including a photodiode structure on a semiconductor substrate, the photodiode structure being positioned adjacent a light-incident upper surface of the image sensor. An isolation grid surrounds each photodiode structure and defines the pixel boundary. The isolation grid extends to a depth of at least the thickness of the photodiode structure and is configured to prevent light incident on the pixel from penetrating through the incident pixel to an adjacent pixel. Optionally, the isolation grid extends substantially through the depth of the semiconductor substrate, preventing electrical crosstalk between adjacent pixels.

A positive diffusion plug vertically extends through at least a portion of the photodiode structure. A negative diffusion plug vertically extends into the semiconductor substrate and electrically communicates with the photodiode structure to transfer charges generated by incident light in the photodiode to a charge collecting region of the image sensor positioned within the semiconductor substrate.

Positioned beneath the photodiode structure is pixel circuitry for controlling charge transfer from the photodiode to image readout circuitry. The pixel circuitry is at least partially formed within the semiconductor substrate.

BRIEF DESCRIPTION OF THE DRAWINGS

FIGS. 1A-1U depict, in cross-section, the formation of portions of a CMOS image sensor and formation of portions of the sensor's pixel circuitry.

FIGS. 2A-2K depict, in cross-section, bonding of a glass handling wafer, formation of vias through the glass wafer, and formation of a color filter to form a CMOS image sensor.

DETAILED DESCRIPTION

The fabrication of a CMOS image sensor having isolation grids is depicted with respect to the drawings in which FIG. 1A depicts a cross-sectional view of a p-doped silicon wafer 100 having a photodiode structure formed thereon. In this exemplary embodiment, the photodiode structure is an epitaxial p-i-n layer structure formed on the substrate; however, any photodiode structure can be used in the image sensor of the present invention. The n-layer (n-doped silicon) is designated as 110, the i-layer (intrinsic or non-doped silicon) as 120 and the p-layer (p-doped silicon) as 130. It is noted that all of the processes of the present invention rely on well-established CMOS fabrication techniques; therefore, detailed description of the process conditions is well-known to those of ordinary skill in the art. Any CMOS processing technique can be used to form the various layers and structures of the present invention.

A glass/$SiO_2$ layer 140 is formed over the p-i-n structure. A patterned photoresist layer (or other implant mask) 150 is formed in FIG. 1B and a circular hole etched through layer 140 using the implant mask 150. Through this hole, ion implantation with a p-type dopant is performed to create a p-diffusion plug 135. The diffusion plug optionally has a circular cross section, as best seen in the top view of FIG. 1C. Note that the ion implantation converts the i-layer and n-layer within the implant cross-sectional area to a p-type material to form the p-type diffusion plug 135, as can be seen in FIG. 1D. The p-type diffusion plug passes through the p-type layer 130 and electrically communicates with that layer. Also shown in FIG. 1D is the removal of the patterned photoresist (or other implant mask) 150 and formation of another silicon oxide layer 160.

To facilitate sensor formation, a silicon handling wafer 170 is bonded to the surface of silicon oxide layer 160 in FIG. 1E. Silicon handling wafer 170 may be bonded through direct oxide bonding or through an adhesive. Because the silicon handling wafer is eventually removed, high bond strength is not necessary. The resulting structure is annealed.

In FIG. 1F, the p-type silicon substrate is thinned by a suitable technique such as etching or polishing. In FIG. 1G, the structure has been "flipped" so that silicon handling wafer 170 now appears at the bottom of the stack. The thinned p-type silicon substrate is patterned with a photoresist 175 having a rectangular cross-sectional opening (although any other shape can also be used). Through this opening, n-type dopants are implanted into the p-type substrate to create an n-type diffusion plug 180 (shown in FIG. 1H) up to a depth sufficient to electrically communicate with the photodiode structure; as depicted in FIG. 1H the n-type diffusion plug extends to a depth adjacent to n-type layer 110. As seen in the top view of FIG. 1I, the resulting n-diffusion plug 180 has a rectangular cross-sectional shape although other shapes can be selected such as a circular cross-sectional shape. Note that the top view depicts relative locations of the diffusion plugs, not their respective depths.

In FIG. 1H, the photoresist is removed, the resulting structure is annealed, and oxide 190 and silicon nitride 220 are deposited. A patterned photoresist layer 200 is formed on oxide 190 and silicon nitride 220, and etching is performed to form a shallow trench 210 through oxide 190 and silicon nitride, and into p-type wafer 100 (FIG. 1J). An oxide layer 230 is deposited into trench 210 (FIG. 1L)

A patterned photoresist layer 235 is formed on the p-type silicon wafer 100 with oxide layer 230 and n-doped diffusion plug 180 as seen in FIG. 1M. The photoresist opening exposes a region for n-dopant implantation. As with previous implantations, the n-dopant converts a portion of the p-type silicon wafer 100 into an n-region, in this case forming n-well 240, depicted in FIG. 1N. The ion-implanted structure is annealed followed by deposition of a gate oxide layer 250 and a polysilicon gate electrode layer 260 over the gate oxide layer in FIG. 1N. The gate electrode and gate oxide layers are patterned and etched in FIG. 1O to form discrete structures 270, 280, and 290 that will form the basis for pixel circuitry. A patterned photoresist layer 300 is formed in FIG. 1P for n-dopant implantation. As in the previous processes, the n-implantation converts portion of the p-doped silicon wafer to n-doped regions 310 and 315. N-doped region 310 is the floating diffusion region for storing charge transferred from the photodiode structure (FIG. 1Q). Structure 290 is the gate transfer transistor for controlling charge transfer from the photodiode to the floating diffusion region 310.

The photoresist is removed and the resulting structure is annealed in FIG. 1Q. To create the p-n junctions for device 270, a further layer of patterned photoresist 320 is formed and p-type dopants are implanted into n-well 240 forming p regions 330 seen in FIGS. 1R and 1S. Device 270 is used as source follower transistor for pixel readout. Device 280 is a reset transistor for discharging charges stored in the n diffusion region and for resetting the pixel between consecutive pixel readouts. In FIG. 1S, the photoresist is removed and the resulting structure is annealed.

In FIG. 1T, an inter-layer-dielectric (ILD) layer 340 (silicon oxide, silicon oxynitride, silicon nitride, polymer or other isolation material) is deposited over pixel circuitry devices 270, 280, and 290. Inter-layer-dielectric (ILD) layer 340 is patterned and etched to form vias for metallization for devices 270, 280, and 290 as well as for devices 360 and 370 which form part of the readout circuitry. Following formation of this metallization, a second inter-layer-dielectric (ILD) layer 350 is formed, patterned, and metallized.

In FIG. 1U vertical interconnects 380 are formed in inter-layer-dielectric (ILD) layer 350 along with redistribution layer metallization 390. Not shown are various external circuitry configurations for pixel addressing and pixel signal processing. Such circuitry is well-known in the art and such known pixel addressing and readout circuitry is used with the image sensor of the present invention along with known signal processing circuitry. Following metallization, a passivation layer 400 (silicon oxide, silicon oxynitride, silicon nitride, polymer or other isolation material) is formed.

It is noted that the pixel circuitry of FIG. 1 is merely exemplary. Numerous configurations of pixel addressing and readout circuitry are well known in the CMOS image sensor art including combinations of three, four, and five pixel transistors. Any pixel circuitry configuration that is capable of reading and transferring the charge from the photodiode structure is contemplated for use in the present invention, as long as it positioned beneath the photodiode structure. In this way, the photodiode structure can have the largest possible fill factor since the pixel circuitry does not interfere with the incident light path to the photodiode structure.

Turning to FIG. 2, a glass handling wafer 410 is bonded over the passivation layer 400 in FIG. 2A. This can be performed through direct oxide bonding or through an intermediate adhesive material. Using the glass handling wafer, the silicon handling layer can be thinned using oxide layer 140 as an etch stop, as seen in FIG. 2B. Any conventional mechanical or chemical etching or polishing technique can be employed.

The orientation in FIG. 2C is "flipped" from the orientation shown in FIG. 2B and an antireflective coating 420 is formed over oxide layer 140. To prevent optical crosstalk between adjacent pixels, an isolation layer is formed between the pixels. The isolation layer forms a grid structure throughout the image sensor, each individual grid defining an individual pixel boundary. As seen in FIG. 2D, a patterned photoresist layer 430 is formed over the antireflection coating and trenches 435 are etched for the deposition of the isolation material. In FIG. 2E, the isolation material 440 is deposited into the trenches 435 and the photoresist removed. In an exemplary embodiment, the isolation material 440 is optically reflective to prevent incident light from entering adjacent pixels as well as reflecting light into the pixel photodiode structure to further enhance light capture by the photodiode. To prevent optical crosstalk, the isolation material only needs a thickness on the order of nanometers, although thicker material layers can also be used. As seen in FIG. 2E, the isolation grid is formed to a depth that is at least equal to the thickness of the photodiode structure for prevention of optical crosstalk. Optionally, isolation grid can be extended through the thickness of the semiconductor substrate in order to prevent electrical crosstalk between adjacent pixels.

In FIG. 2F a color filter 450 is deposited. In FIG. 2F a red filter 450 is shown while green 460 and blue 470 filters are shown as formed in FIG. 2G to form a sensor array. The filter pattern may be a Bayer pattern, Bayer derivative pattern, or any other desired filter pattern as is known in the art. Due to combination of the high fill factor of the photodiode structure and the use of the isolation grid, it is unnecessary to form a microlens array over the color filters. Because microlenses require a pixel size of at least 1.2 microns, elimination of the need for microlenses permits creation of pixels that are less than 1.2 microns. Consequently, image sensors with higher pixel densities and higher resolution can be formed.

As seen in FIG. 2H, a protective glass cover layer 480 is bonded over the filters without a microlens layer. In FIG. 2I, the glass handling wafer 410 is thinned by a suitable etching or polishing process. In FIG. 2J, through vias 490 are created in glass handling wafer 410, connecting to the redistribution layer 390. Bonding pads 500 are also created. Solder joints 510 are formed in FIG. 2K.

Operation of the image sensors of the present invention is as follows. Incident light passes through glass cover layer 480 and is incident upon red filter 450 which selects for red wavelengths (similarly for green and blue filters 460 and 470). The color filtered light passes through the antireflection layer and into the photodiode structure, generating charges from the incident light photons.

The transfer gate 290 is activated to transfer the charges from the photodiode to the floating diffusion region 310 via the diffusion plugs 180, 135. Therefore, the transfer gate plays a switching role so that the charges can be temporarily stored in photodiode. A readout node electrically communicates with floating diffusion region 310 rather than the photodiode structure of the photodiode region, and thus the use of diffusion plugs does not delay the charge transfer. Reset gate 280 readies the imaging pixel for the next image, and source follower gate 270 transfers out the image data acquired by photodiode structure of the imaging pixel.

Advantageously, the present invention forms both the photodiode and portions of the pixel circuitry in/on the same silicon wafer. The use of a bonded glass wafer for various metallizations assures alignment of the vias and bonding pads with their respective devices. The use of glass is more reliable and results in less stress than the use of silicon and increases the lifetime of the image sensor. The positioning of the pixel circuitry behind the photodiode permits greater than 90% fill factor and preferably greater than 95% fill factor of the photodiode. The structure of the isolation grid layers minimizes optical and, optionally, electrical crosstalk and enhances the light capture of the photodiode by reflecting non-normal incident rays into the photodiode. As a result, the overall optical efficiency of the image sensor is significantly enhanced without requiring microlenses.

While the foregoing invention has been described in terms of the above exemplary embodiments, it is understood that various modifications and variations are possible. For example, all of the embodiments have been described with respect to a particular p or n doping. As is well known in the semiconductor fabrication art, the conductivity of each doped region can be changed to its opposite conductivity (that is, p regions can be changed to n regions and n regions to p regions) to create an essentially identical device with opposite doping. Thus in both the specification and the following claims, it is understood that an equivalent "oppositely doped" device is also encompassed by the disclosure and claim scope. Accordingly, such modifications and variations are within the scope of the invention as set forth in the following claims.

What is claimed is:

1. A high optical efficiency CMOS image sensor comprising:
a plurality of imaging pixels, each pixel including a photodiode structure on a semiconductor substrate, the photodiode structure being positioned adjacent a light-incident upper surface of the image sensor to receive incident light and generate electrical charges from the received incident light;
an isolation grid surrounding the photodiode structure and defining an imaging pixel boundary, the isolation grid extending to a depth of at least the thickness of the photodiode structure, the isolation grid being configured to prevent the light incident on the pixel from penetrating through the incident pixel to an adjacent pixel;
a positive diffusion plug vertically extending through at least a portion of the photodiode structure; a negative diffusion plug vertically extending into the semiconductor substrate beneath the photodiode structure and electrically communicating with the photodiode structure to transfer the electrical charges generated by the incident light in the photodiode structure to a charge collecting region of the image sensor positioned within the semiconductor substrate; pixel circuitry for controlling charge transfer from the photodiode structure to image readout circuitry, the pixel circuitry being positioned beneath the photodiode structure with at least a portion of the pixel circuitry being formed within the semiconductor substrate.

2. The high optical efficiency CMOS image sensor according to claim 1 further comprising an optical color filter positioned over each of the imaging pixels.

3. The high optical efficiency CMOS image sensor according to claim 1 wherein the incident light-receiving area of each photodiode structure is at least 90% of the area of a pixel.

4. The high optical efficiency CMOS image sensor according to claim 1 wherein the incident light-receiving area of each photodiode structure is at least 95% of the area of a pixel.

5. The high optical efficiency CMOS image sensor according to claim 1 wherein the charge collecting region of the image sensor positioned within the semiconductor substrate is a floating diffusion region.

6. The high optical efficiency CMOS image sensor according to claim 5 wherein the pixel circuitry includes plural transistors, one of said plural transistors being a transfer gate configured to transfer electrical charges from the photodiode structure to the floating diffusion region via the diffusion plugs.

7. The high optical efficiency CMOS image sensor according to claim 6 further comprising a reset transistor.

8. The high optical efficiency CMOS image sensor according to claim 2 wherein the image sensor is configured to receive the incident light directly through the optical color filter without a layer of microlenses.

9. The high optical efficiency CMOS image sensor according to claim 1 wherein each pixel is smaller than 1.2 microns.

10. The high optical efficiency CMOS image sensor according to claim 1 wherein the isolation grid extends through the semiconductor substrate to the portion of the pixel circuitry formed within the semiconductor substrate to prevent electrical crosstalk between adjacent pixel circuitry.

11. A microlens-free high optical efficiency CMOS image sensor comprising:
a plurality of imaging pixels, each pixel including a photodiode structure on a semiconductor substrate, the photodiode structure being positioned adjacent a light-incident upper surface of the image sensor to receive incident light and generate electrical charges from the received incident light, each photodiode structure light-receiving area being at least 90% of the cross-sectional area of the pixel;
a positive diffusion plug vertically extending through at least a portion of the photodiode structure;
a negative diffusion plug vertically extending into the semiconductor substrate beneath the photodiode structure and electrically communicating with the photodiode structure to transfer the electrical charges generated by the incident light in the photodiode structure to a floating diffusion charge collecting region of the image sensor positioned within the semiconductor substrate;

pixel circuitry for controlling charge transfer from the photodiode structure to the floating diffusion region and to image readout circuitry, the pixel circuitry being positioned beneath the photodiode structure with at least a portion of the pixel circuitry being formed within the semiconductor substrate; an isolation grid surrounding the photodiode structure and defining an imaging pixel boundary, the isolation grid extending from a sensor surface through the semiconductor substrate to a depth of the portion of the pixel circuitry formed within the semiconductor substrate, the isolation grid configured to prevent the light incident on the pixel from penetrating through the incident pixel to an adjacent pixel and further configured to prevent electrical crosstalk between pixel circuitry of adjacent pixels.

12. A microlens-free high optical efficiency CMOS image sensor according to claim 11 further comprising a glass handling wafer bonded to the semiconductor substrate and including pixel metallization.

13. A microlens-free high optical efficiency CMOS image sensor according to claim 11 wherein the pixel circuitry includes plural transistors, one of said plural transistors being a transfer gate configured to transfer electrical charges from the photodiode structure to the floating diffusion region via the diffusion plugs.

14. A microlens-free high optical efficiency CMOS image sensor according to claim 13 further comprising a reset transistor.

15. A microlens-free high optical efficiency CMOS image sensor according to claim 11 wherein each pixel is smaller than 1.2 microns.

* * * * *